April 8, 1969 D. M. DUNCAN 3,437,945

TRANSFORMERLESS TRANSISTOR OUTPUT AMPLIFIER

Filed Nov. 10, 1965

INVENTOR.
DAVID M. DUNCAN,

BY [signature] & [signature]

ATTORNEYS

United States Patent Office 3,437,945
Patented Apr. 8, 1969

3,437,945
TRANSFORMERLESS TRANSISTOR OUTPUT AMPLIFIER

David M. Duncan, San Francisco, Calif., assignor to Fairchild Camera and Instrument Company, Syosset, N.Y., a corporation of Delaware Filed Nov. 10, 1965, Ser. No. 507,139
Int. Cl. H03f 3/18
U.S. Cl. 330—13 4 Claims

ABSTRACT OF THE DISCLOSURE

A transformerless transistor amplifier circuit having a complementary symmetry transistor amplifier, an input drive circuit for the amplifier, and a drive transfer circuit connected between the amplifier and the input drive circuit, the drive-transfer circuit including a biasing circuit adapted to prevent either transistor of the complementary pair from being driven either to saturation or to cutoff in the absence of an input current to the input drive circuit.

This invention relates to a transistor power amplifier and, more particularly, to a novel transformerless output power amplifier.

In the prior art, complementary-symmetry output amplifiers have been employed to provide a single-ended power output amplifier for driving relatively low-impedance load devices. The complementary-symmetry amplifier may be described as an arrangement of a pair of transistors connected in series with the upper output transistor of the series pair being of one polarity type (e.g., NPN) and the lower output transistor of the pair being of the opposite polarity type (e.g., PNP). These prior art complementary-symmetry amplifiers have been driven generally from a single-ended source applied to both bases of the complementary-symmetry pair and have included some bootstrapping. Bootstrapping is a common term in the art which refers to the inclusion of a feedback loop to increase the supply voltage at certain points in a circuit.

The above-described circuit approaches to complementary-symmetry amplifiers have worked well with germanium transistors but when applied to silicon transistors, these circuits generally operate at lower efficiencies and, as a result, have been less practical. Because of bootstrapping and the need for decoupling resistors, the circuits result in the dissipation of a significant percentage of the available output power. In general, these circuit arrangements allow only the upper output transistor to be saturated, resulting in a loss of the available output voltage and power. In other prior art arrangements which sometimes have been used, the emitters of the output transistors are maintained at a point of zero signal potential. This arrangement allows the output transistors to be driven into saturation but requires that the power supply be floating above the point of zero signal potential; this is undesirable.

This invention employs a new complementary-symmetry circuit arrangement which overcomes the above-mentioned disadvantages. This is accomplished by connecting the emitters of the transistors employed in the complementary-symmetry circuit across the entire supply voltage. Such connection of the emitters is made possible by the use of a transfer transistor or amplifier. This arrangement operates as a class-B amplifier without distortion and eliminates the need for bootstrap circuits while enabling the complementary-symmetry circuit transistor to fully saturate or closely approach such saturation. The overall efficiency of the circuit is improved and the previously-mentioned power dissipation and loss does not occur.

The new circuit works with transistors of either polarity type, does not require a floating power supply, and may readily be integrated. The same basic principle, that is, a complementary-symmetry circuit coupled to a transfer transistor, can be applied to the well-known "quasi-complementary" transformerless audio output circuit and similar circuits.

Briefly, the structure of the invention comprises a complementary-symmetry amplifier; and, a drive-transfer transistor coupled to said complementary-symmetry amplifier, whereby efficient circuit operation is provided.

The novel circuit arrangement of this invention, its salient features and its advantages will be more fully understood from the specification and drawings which follow, in which.

Figures 1, 2, 3, 4:
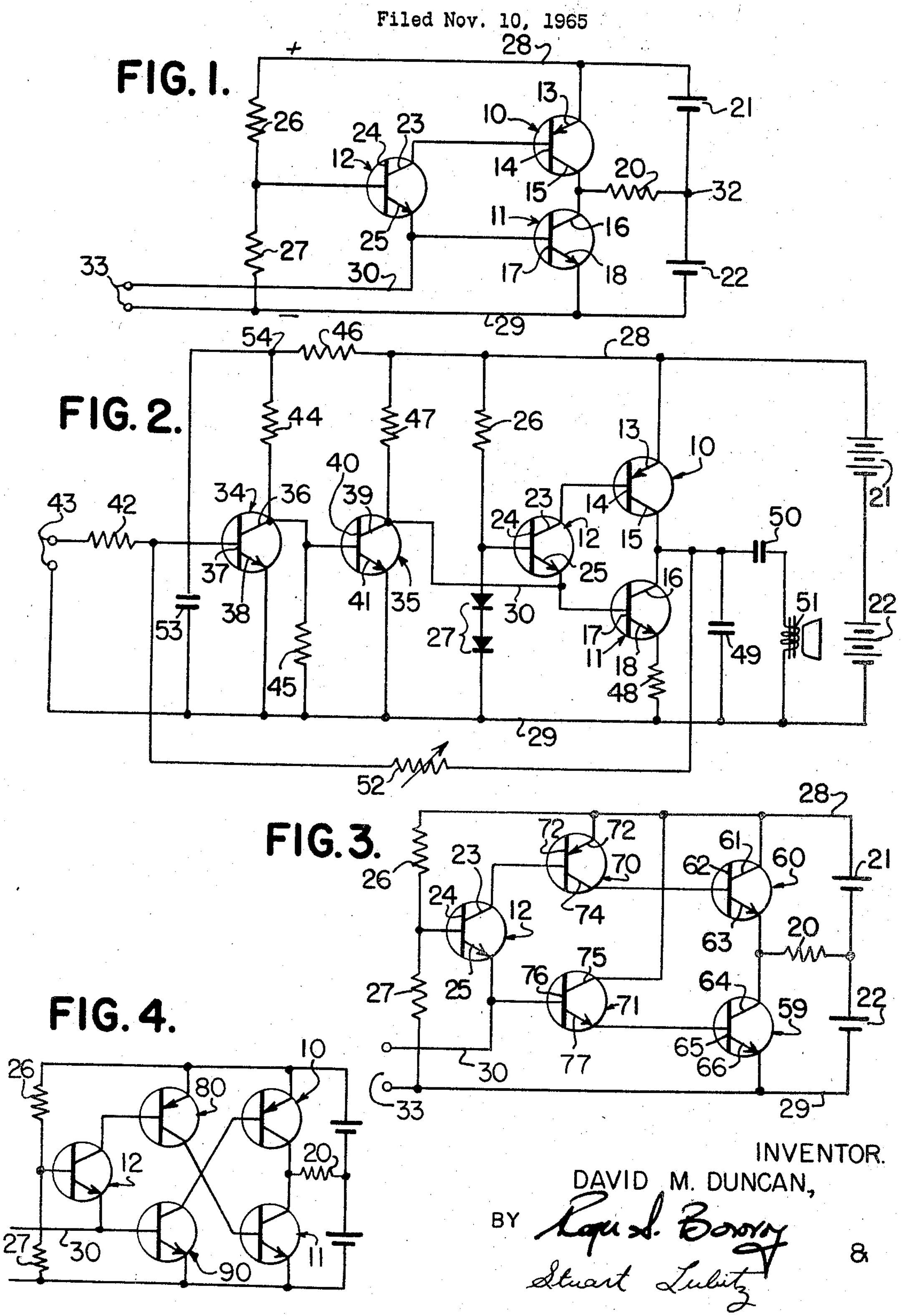
FIG. 1 is a schematic circuit diagram of a complementary-symmetry pair and transfer transistor connected in circuit.
FIG. 2 is a schematic circuit diagram of a complete amplifier incorporating the circuit of FIG. 1.
FIG. 3 is a schematic circuit diagram showing another embodiment of the invention; and, FIG. 4 represents still another embodiment.

Referring now to FIG. 1, there is shown a complementary-symmetry output amplifier pair 10 and 11 coupled to transfer transistor 12, which acts as a drive-transfer transistor amplifier. The upper transistor 10 of the series complementary-symmetry pair is a PNP transistor having an emitter 13, a base 14, and a collector 15. The lower transistor 11 of the complementary-symmetry pair is an NPN transistor having a collector 16, a base 17, and an emitter 18. Transfer transistor 12, which is an NPN transistor, has a collector 23, a base 24, and an emitter 25.

The source of potential for the amplifier shown in FIG. 1 is provided by series-connected batteries 21 and 22. The junction of the two batteries 21 and 22 shown at 32 represents a return point for an output load resistor 20 connected between collectors 15 and 16 of the complementary-symmetry pair. The positive line 28 is connected to emitter 13 of upper transistor 10 and the negative line 29 is connected to emitter 18 of lower transistor 11, whereby the complementary-symmetry pair is connected across the entire voltage of batteries 21 and 22. The collector 23 and emitter 25 of transfer transistor 12 are connected to base 14 of upper transistor 10 and base 17 of lower transistor 11, respectively. A top biasing resistor 26 is connected from base 24 of transfer transistor 12 to positive line 28. A lower biasing resistor 27 is connected from base 24 to the negative potential line 29. Resistor 27, while shown as a resistor herein, can be either a resistor, a thermistor or a diode. The quiescent current through the series transistor pair 10 and 11 is set by the resistors 26 and 27. Input connections 33 may be used to couple an input signal along the line 30 to the base 17 of lower transistor 11 and the emitter 25 of transfer transistor 12.

The operation of the circuit of FIG. 1 will now be considered. For purposes of understanding the operation of the circuit, the transfer transistor 12 may be considered a grounded-base amplifier. Without an A-C signal applied to input 33, transistor 12 is forward biased by resistors 26 and 27 and conducting via the base-emitter junction of upper transistor 10 and the base-emitter junction of lower transistor 11, thus, forward biasing transistors 10 and 11. Therefore, in the quiescent state all transistors are conducting.

During the positive half-cycle of the A-C signal applied at input 33 along line 30, the lower transistor 11 conducts more strongly and simultaneously transistor 12 is caused to conduct less strongly. More specifically, the positive input signal at base 17 of transistor 11 further forward biases transistor 11. Transistor 12, on the other hand, receives the positive signal at its emitter 25. This results in a lowered collector current at collector 23 of transistor 12. The decrease in the collector current of transistor 12 increases the positive bias on base 14 of upper transistor 10 and results in a decrease in current flow through transistor 10. Ultimately, at some point during the positive half-cycle, transistors 10 and 12 are cut off. The drive is thus completely transferred to the lower transistor 11. The signal is thereby amplified in transistor 11 to appear across load resistor 20.

During the negative half-cycle of the input signal applied to input 33, the current through the lower transistor 11 is first reduced by the negative potential of this signal applied to its base 17. At the same time the negative signal is applied to emitter 25 of transfer transistor 12, thus, increasing the current through upper transistor 10 of the complementary pair. The lower transistor 11 is eventually completely cut off and all of the drive is transferred to the upper transistor 10. The negative half-cycle is now amplified by transistor 10 to appear across the same output load resistor 20.

When transistors 10 and 11 are properly matched and transistor 12 has a moderate gain, the overall current gain between the drive input at 33 and the load 20 is the same whether the upper transistor, the lower transistor, or both transistors (near quiescent condition) are conducting. For this reason the circuit arrangement of this invention as shown in FIG. 1 operates as a linear, class-B amplifier without cross-over distortion. There is a smooth transition between the conduction of the upper and lower transistors through the zero line. Without bootstrapping and with the full potential difference of batteries 21 and 22 applied across the complementary symmetry pair, the upper transistor and lower transistor can both be fully saturated and the operation is more efficient than prior art circuits.

In FIG. 2 an embodiment of the invention is shown including input drive pre-amplifiers to excite the drive-transfer transistor 12 and the series-connected complementary symmetry pair transistors 10 and 11. The complementary symmetry pair and transfer transistor part of the circuit shown in FIG. 2 incorporate elements which are substantially identical with those shown in FIG. 1 and, therefore, bear the same identifying reference numerals.

In the portion of the circuit of FIG. 2 which corresponds to the elements of FIG. 1 directly, it can be seen that a current-limiting resistor 48 has been placed in series with emitter 18 of transistor 17, and in place of resistor 27 a pair of diodes shown at 27 are connected in series between base 24 of transistor 12 and the negative line 29. Diodes 27 are termed biasing diodes and maintain the bias at base 24 of transistor 12 at a predetermined level. Biasing diodes 27 are preferably of the same semi-conductor material as the output and drive-transfer transistors (i.e., either silicon or germanium) so as to have close to the same temperature coefficient as the transistors.

Transistors 34 and 35 constitute a direct-coupled input drive pre-amplifier for the drive or input signal which is applied to the base 17 of lower transistor 11 and emitter 25 of transfer transistor 12. NPN transistor 34 has a collector 36, a base 37 and an emitter 38. Resistor 44 is connected to collector 36 and functions as a collector load resistor. Resistor 45 is a base-bias return resistor for the base 40 of transistor 35 connected thereto and also connected to collector 36 of transistor 34. The emitter 38 of transistor 34 is connected directly to the negative line 29. The input connection 43 is connected to the base 37 of transistor 34 through a current-limiting resistor 42. A resistor 46 connected between resistor 44 and the positive line 28 acts as a decoupling resistor for transistor 34. The capacitor 53 between circuit point 54 joining resistors 44 and 46 and the negative line 29 constitutes a decoupling filter capacitor. Transistor 35 has a collector 36, an emitter 41, and a base 40. The collector 36 of transistor 34 is directly connected to base 40 of transistor 35. A resistor 47 is connected from collector 39 of transistor 35 to the positive line 28. The emitter 41 of transistor 35 is connected to the negative line 29 and collector 39 is directly connected to the junction between emitter 25 of transfer transistor 12 and base 17 of lower transistor 11.

At the junction between collector 15 of upper transistor 10 and collector 16 of lower transistor 11 (the output load connection), a load device in the form of loudspeaker 51 is connected through a coupling capacitor 50. A very high-frequency by-pass capacitor 49 is connected between the output load connection and the negative line 29. Also, from the output load connection between the collectors of transistors 10 and 11, a direct current feedback variable resistor 52 is connected to the base 37 of transistor 34. Resistor 52 is to be adjusted so that the degree of feedback matches the circuit components used in a particular embodiment as shown in FIG. 2.

The operation of the circuit embodiment shown in FIG. 2 is basically identical with the description previously given for the operation of the circuit shown in FIG. 1. During the positive half-cycle of an input signal applied along line 30, transistor 11 primarily amplifies the input signal coupling through capacitor 50 into load 51 which returns to the zero potential point 29 represented by the negative line 29. When, on the other hand, the negative half-cycle of the input signal is applied to line 30, transistor 10 primarily amplifies the signal coupling through capacitor 50 to load 51, the return being also to the negative power supply line 29. The circuit in FIG. 2 differs particularly in the output load portion. Through the use of the coupling capacitor 50 to drive the load loudspeaker 51, it becomes unnecessary to provide a center-tapped power supply. By virtue of the direct-current feedback path through variable resistor 52 to the base 37 of the input transistor 34, the direct-current center-point of the available output voltage swing is maintained equally between the two extremes of the available output signal. In addition, transistors 34 and 35 provide the required pre-amplification of the signal supplied to line 30.

Although in the circuits shown in FIGS. 1 and 2 the upper transistor is of the PNP polarity type and the lower transistor of an NPN polarity type, it should be obvious to one skilled in the art that the polarities of the respective transistors may be reversed with the consequent polarity reversal of the power supply. In the circuit of FIG. 2, a polarity reversal of the input transistors 34 and 35 would also be required.The particular advantages of the circuit shown in FIG. 2 are that both the output transistors are fully saturated in their operation and that there is no loss of output power which in prior art circuits would have resulted from bootstrapping or decoupling circuits. Like that of the circuit of FIG. 1, the circuit of FIG. 2 provides greater efficiency than prior art circuits.

The circuits hereinabove described in connection with FIGS. 1 and 2 may also be used in connection with a quasi-complementary single-ended transistor output circuit such as shown in FIG. 3. In this circuit a pair of NPN transistors 59 and 60 are connected in series across batteries 21 and 22 between positive line 28 and negative line 29. Transistor 60 has a collector 61 connected to positive line 28 and transistor 59 has an emitter 66 connected to negative line 29. Emitter 63 of transistor 60 is connected to collector 64 of transistor 59 with the midpoint therebetween connected to load resistor 20. A PNP transistor 70 has its collector 74 directly coupled to base 62 of transistor 60 and its emitter 72 coupled to positive line 28. An NPN transistor 71 has its emitter 77 directly coupled to base 65 of transistor 59 and its collector 75 coupled to positive line 28.

Drive-transfer transistor 12 is identical with drive-transfer transistor 12 shown in the previous diagrams. Drive-transfer transistor 12 has a collector 23 connected to base 73 of transistor 70 and an emitter 25 connected to base 76 of transistor 71. Resistors 26 and 27 are connected in series across lines 28 and 29 and base 24 of transistor 12 is connected to the junction of resistors 26 and 27. The transistors 71 and 70 may be considered a complementary-symmetry driver circuit in which the transistor 70 is of the PNP type and the transistor 71 of the NPN type. The transistors 59 and 71 may be considered a Darlington transistor configuration in which both transistors are of the same conductivity type (e.g., NPN).

Transistors 59 and 60 are driven through transistors 70 and 71 by the drive-transfer transistor 12 in exactly the same manner as the drive-transfer transistor 12 of FIG. 1 drives transistor 10 and 11. Signals supplied to input 33 are applied to emitter 25 of drive-transfer transistor 12 and the base 76 of transistor 71. This causes increased conduction in transistor 71 and, consequently, in transistor 59 as well when the input signal is positive. When the input signal is negative, the conduction of transistor 70 is increased and, consequently, so is the conduction in transistor 60. As in the case of the direct output complementary-symmetry pair circuit shown in FIGS. 1 and 2 and described previously, the transistor 60, when conducting, amplifies the signal into load 20. During this time, the transistor 59 is substantially nonconducting. Alternatively, when transistor 59 is conducting and transistor 60 is substantially nonconducting, the transistor 59 amplifies the signal into the load 20. Here again the linear, class-B operation is achieved as in the previously-described circuits.

The final embodiment of this invention is shown in FIG. 4. This embodiment utilizes a complementary driver stage employing transistors 80 and 90 which are directly coupled to the complementary output transistor pair employing transistors 10 and 11. The transistor 80 has its collector coupled to the base of transistor 11 while the collector of transistor 90 is coupled to the base of transistor 10. The transfer transistor 12 is connected to the transistors 80 and 90 in accordance with the teachings set forth with regard to the embodiments shown in FIGS. 1 to 3. The significant differences between this embodiment and the one shown in FIG. 3 are the use of a complementary output pair 10 and 11 and the manner in which transistors 80 and 90 are connected to this complementary output pair. In this embodiment the transistors 80 and 90 are cross coupled so that the two signal paths (10, 90 and 11, 80) each include an NPN and PNP transistor. With each of the two types of transistors in a circuit path, it is possible to match the two signal paths by matching transistor 80 to transistor 10 and by matching transistor 90 to transistor 11. Thus, transistors having like polarity are matched in order to obtain the desired circuit operation. The matching of like transistors is readily accomplished and, consequently, integration, that is, the fabrication of this embodiment by integrated circuit techniques, is facilitated. In operation during a substantial positive input signal, transistors 10 and 90 are turned on and the transistors 11, 12, and 80 are turned off. During a substantial negative input signal, transistors 11, 12, and 80 are turned on and transistors 10 and 90 are turned off.

There has been described hereinabove a number of circuits with each of them employing a complementary-symmetry circuit of a sort along with a transfer transistor. The circuit may operate as a class-B amplifier with little, if any, distortion. When employed as an output amplifier, the circuit can be used to drive a relatively low-impedance load, such as a loudspeaker, without the need for an output transformer. Furthermore, by virtue of the fact that the elements in the transfer transistor and complementary symmetry circuit are directly coupled one to the other, the circuits are readily adaptable to integration. Thus, the various transistor and other components of this circuit may be fabricated by diffusion, deposition and photoengraving manufacturing techniques to form a monolithic device. By such fabrication methods, the matching of the components is readily achieved.

Although this invention has been disclosed and illustrated with reference to particular applications, the principles involved are susceptible of numerous other applications which will be apparent to persons skilled in the art.

What is claimed is:

1. In a direct-coupled output transformerless transistor linear amplifier:

a series-connected complementary-symmetry transistor amplifier pair including an upper transistor of one polarity type and a matched lower transistor of opposite polarity type;

output means coupled to said transistor pair;

a source of bias potential for said series-connected pair, said source having end terminals with said series pair connected therebetween, said series pair of transistors having their emitters connected between said end terminals;

a drive-transfer circuit including a transistor having its emitter coupled to the base of said lower transistor, its collector connected to the base of the upper transistor and its base coupled to said source of bias potential and including a bias circuit means adapted to prevent either transistor of said pair of transistors in said amplifier from being driven to saturation or cut-off in the absence of an input current to said input drive circuit means; and a signal input connection to the emitter of said drive-transfer transistor, whereby a transformerless amplifier is provided.

2. In a direct-coupled output transformerless transistor linear amplifier:

a series-connected complementary-symmetry transistor amplifier pair including an upper transistor of one polarity type and a matched lower transistor of opposite polarity type the collectors being coupled;

a source of bias potential coupled across the emitters of said series-connected pair, said source having a mid-point and end terminals;

a load impedance connected bteween the coupled collectors of said series pair and said mid-point;

a drive-transfer circuit including a transistor having its emitter coupled to the base of said lower transistor, its collector connected to the base of the upper transistor and its base connected to said source of bias potential and including a bias circuit means adapted to prevent either transistor of said pair of transistors in said amplifier from being driven to saturation or cut-off in the absence of an input current to said input drive circuit means; and a signal input connection to the emitter of said drive-transfer transistor, whereby a transformerless amplifier is provided.

3. In a direct-coupled output transformerless transistor output power linear amplifier:

a series-connected complementary-symmetry transistor amplifier pair including an upper transistor of one polarity type and a matched lower transistor of the opposite polarity type the collectors being coupled;

a source of bias potential for said series-connected pair, said source having a mid-point and end terminals, said series pair being connected between said end terminals;

a load impedance connected between said coupled collectors of said series pair and said mid-point;

a drive-transfer transistor of the same polarity type as said lower transistor, said drive-transfer transistor having a base, a collector and an emitter;

biasing impedances connected in series between the end terminals of said source of potential, the series connection thereof being also connected to said base of said drive-transfer transistor for applying a forward bias thereto, said collector of said drive-transfer transistor being connected to said upper transistor of said series-connected pair, said emitter of said drive-transfer transistor being connected to said lower transistor of said series-connected pair and forming thereat an input junction said biasing impedances adapted to prevent either transistor of said pair of transistors in said amplifier from being driven to saturation or cut-off in the absence of an input current to said input drive circuit means; and a signal input connection to said input junction, whereby each half-cycle of one polarity of any signals applied to said signal-input connection drives said lower transistor towards full conduction and said drive-transfer and said upper transistor towards non-conduction and each half-cycle of opposite polarity of said signals drives said drive-transfer transistor and said upper transistor towards full conduction and said lower transistor towards non-conduction so that said upper and lower transistors amplify the respective half-cycles of said signal, each coupling said amplified signal into said load impedance with appreciable current gain, providing thereby a linear single-ended, class-B, push-pull output operation of said transformerless amplifier.

4. A direct-coupled output transformerless transistor output power linear amplifier comprising:

a series-connected complementary-symmetry transistor amplifier pair including an upper transistor of one polarity type and a matched lower transistor of the opposite polarity type the collectors being coupled;

a load impedance connected between the coupled collectors of said series connected amplifier pair and a point or reference potential;

a drive-transfer circuit including a transistor of the same polarity type as said lower transistor, said drive-transfer transistor being connected to said upper transistor of said series-connected pair and said lower transistor of said series-connected pair and forming at said lower transistor an input junction, and including a bias circuit means adapted to prevent either transistor of said pair of transistors in said amplifier from being driven to saturation or cutoff in the absence of an input current to said input drive circuit means; and, a signal input connection to said input, whereby each half-cycle of one polarity of any signals applied to said signal input connection drives said lower transistor towards full conduction and said drive-transfer and said upper transistor towards nonconduction and each half-cycle of opposite polarity of said signals drives said drive-transfer transistor and said upper transistor towards full conduction and said lower transistor towards nonconduction so that said upper and lower transistors amplify the respective half-cycles of said signal, each coupling said amplified signal into said load impedance with appreciable gain providing thereby a linear single-ended, class-B, push-pull output operation of said transformerless amplifier.

References Cited

UNITED STATES PATENTS 3,114,112 12/1963 Cochran ------------ 330—17

FOREIGN PATENTS 1,261,989 4/1961 France.
1,185,255 1/1965 Germany.

ROY LAKE, *Primary Examiner.*

SIEGFRIED H. GRIMM, *Assistant Examiner.*

U.S. Cl. X.R.

330—15, 17, 18.